United States Patent
Murakami et al.

(10) Patent No.: US 8,414,735 B2
(45) Date of Patent: Apr. 9, 2013

(54) RING-SHAPED COMPONENT FOR USE IN A PLASMA PROCESSING, PLASMA PROCESSING APPARATUS AND OUTER RING-SHAPED MEMBER

(75) Inventors: Takahiro Murakami, Nirasaki (JP); Nobuhiro Sato, Miyagi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/233,968

(22) Filed: Sep. 15, 2011

(65) Prior Publication Data
US 2012/0006488 A1 Jan. 12, 2012

Related U.S. Application Data

(62) Division of application No. 11/511,404, filed on Aug. 29, 2006, now Pat. No. 8,038, 837.

(60) Provisional application No. 60/722,991, filed on Oct. 4, 2005.

(30) Foreign Application Priority Data

Sep. 2, 2005 (JP) .................................. 2005-255179

(51) Int. Cl.
*C23F 1/00* (2006.01)
*H01L 21/306* (2006.01)
*C23C 16/00* (2006.01)

(52) U.S. Cl.
USPC ............. 156/345.43; 156/345.51; 118/723 E; 118/728

(58) Field of Classification Search ............. 156/345.43, 156/345.44, 345.45, 345.46, 345.47, 345.51–345.55; 118/715, 722, 723 R, 723 E, 728; 315/111.21
See application file for complete search history.

(56) References Cited

U.S. PATENT DOCUMENTS

| | | | |
|---|---|---|---|
| 5,800,686 A | | 9/1998 | Littau et al. |
| 5,846,332 A | * | 12/1998 | Zhao et al. ..................... 118/728 |
| 6,284,093 B1 | * | 9/2001 | Ke et al. ................... 156/345.51 |
| 6,294,093 B1 | * | 9/2001 | Selvarajan et al. ........... 210/708 |
| 6,676,804 B1 | | 1/2004 | Koshimizu et al. |
| 2002/0139478 A1 | * | 10/2002 | Ma et al. .................. 156/345.47 |
| 2004/0069227 A1 | | 4/2004 | Ku et al. |
| 2004/0129226 A1 | | 7/2004 | Strang et al. |

FOREIGN PATENT DOCUMENTS

| | | |
|---|---|---|
| JP | 2000-36490 | 2/2000 |
| JP | 2000-173988 A | 6/2000 |
| JP | 2002-217171 A | 8/2002 |
| JP | 2002-246370 A | 8/2002 |
| JP | 2004-260159 A | 9/2004 |
| JP | 2005-64460 A | 3/2005 |
| JP | 2005-191023 A | 7/2005 |

* cited by examiner

*Primary Examiner* — Maureen Gramaglia
(74) *Attorney, Agent, or Firm* — Rothwell, Figg, Ernst & Manbeck, P.C.

(57) ABSTRACT

A ring-shaped component for use in a plasma processing includes an inner ring-shaped member provided to surround an outer periphery of a substrate to be subjected to the plasma processing and an outer ring-shaped member provided to surround an outer periphery of the inner ring-shaped member. The outer ring-shaped member has a first surface facing a processing space side and a second surface facing an opposite side of the plasma generation side. The second surface has thereon one or more ring-shaped grooves.

14 Claims, 6 Drawing Sheets

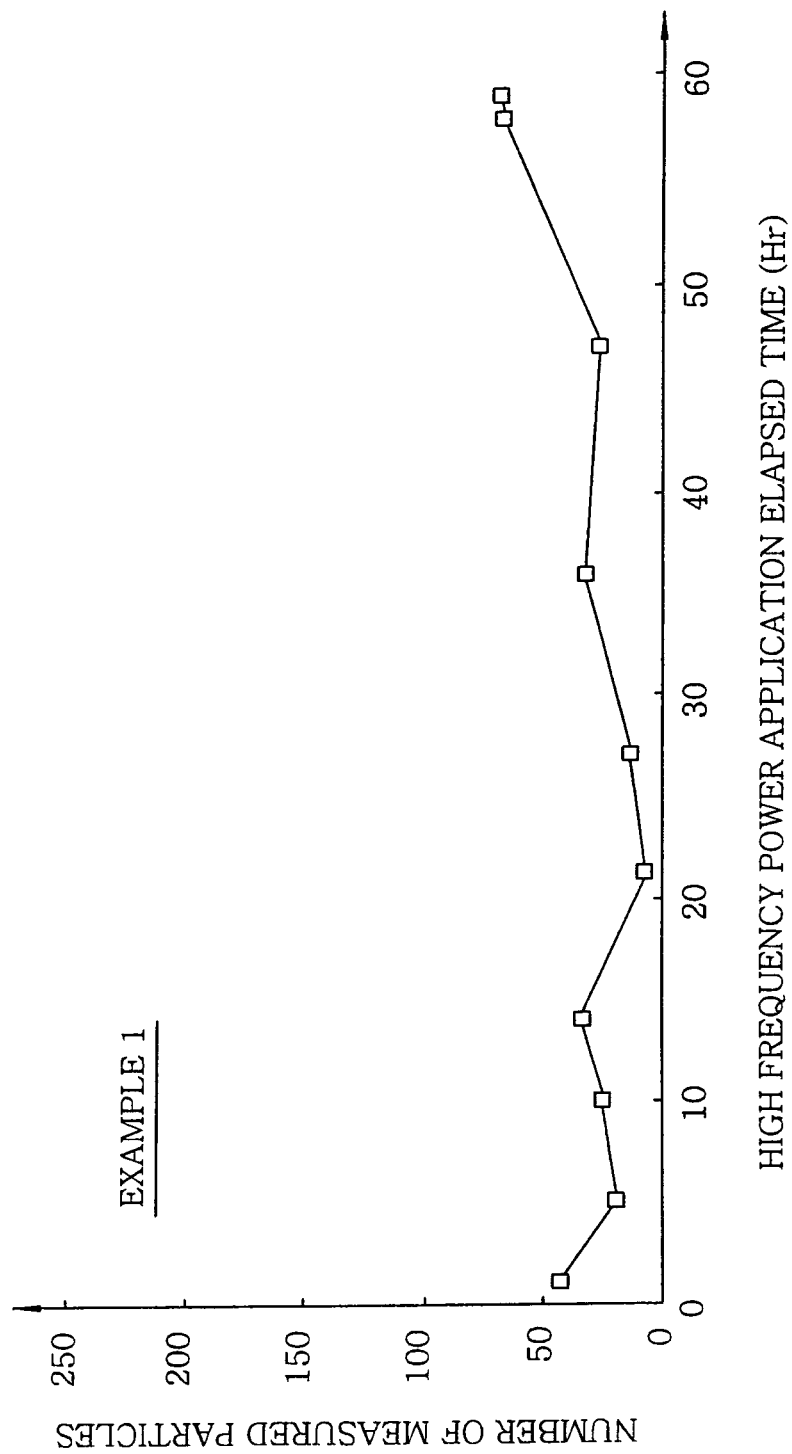

RING-SHAPED COMPONENT FOR USE IN A PLASMA PROCESSING, PLASMA PROCESSING APPARATUS AND OUTER RING-SHAPED MEMBER

CROSS-REFERENCE TO RELATED APPLICATIONS

This application is a divisional of U.S. application Ser. No. 11/511,404, filed on Aug. 29, 2006, the entire contents of which is incorporated herein by reference. U.S. application Ser. No. 11/511,404 claims the benefit of priority under 119 (e) of U.S. Provisional Application No. 60/722,991, filed Oct. 4, 2005, and claims the benefit of priority under 35 U.S.C. §119 to Japanese Patent Application No. 2005-255179, filed on Sep. 2, 2005.

FIELD OF THE INVENTION

The present invention relates to a ring-shaped component for use in a plasma processing, a plasma processing apparatus and an outer ring-shaped member; and, more particularly, to a ring-shaped component for use in a plasma processing, surrounding an outer periphery of a substrate to be subjected to the plasma processing in a processing chamber.

BACKGROUND OF THE INVENTION

In general, a plasma processing apparatus for performing a plasma processing on a circular plate shaped wafer includes a processing chamber for accommodating therein the wafer, a shower head for supplying a processing gas into the processing chamber and a mounting table for mounting thereon the wafer. The mounting table is connected to a high frequency power supply and serves as an electrode for applying a high frequency power into the processing chamber. Such a plasma processing apparatus performs a plasma processing on the wafer by using ions and/or radicals generated by converting the processing gas supplied to the processing chamber into a plasma with the high frequency power applied thereto.

Further, the plasma processing apparatus has a ring-shaped focus ring installed to surround an outer periphery of the wafer mounted on the mounting table in the processing chamber. The focus ring has a double ring structure, including a ring-shaped inner focus ring member provided at an inner portion and a ring-shaped outer focus ring member provided to surround an outer periphery of the inner focus ring member. The inner focus ring member is made of a conductive material such as silicon or the like, whereas the outer focus ring member is made of an insulating material such as quartz or the like. The inner focus ring member concentrates or collects the plasma on the wafer, and the outer focus ring member serves as an insulator for confining the plasma on the wafer.

During the plasma processing, the temperature of the outer focus ring member increases due to a heat from the plasma. However, if the temperature thereof is unstably maintained, an ion and/or a radical density near the outer focus ring member becomes non-uniform, causing the ion and/or radical density in an outer peripheral portion of the wafer to also become non-uniform. Consequently, the central and the peripheral portion of the wafer are plasma-processed differently, which makes it difficult to carry out a uniform plasma processing on the wafer. In addition, as a consequence of the outer focus ring member being scaled up to meet a recent trend for the larger diameter wafer, the temperature rising rate of the outer focus ring member decreases, requiring more time for the temperature to reach a specific value and remain stable thereat. As a result, it becomes difficult to perform a uniform plasma processing on the wafer, which in turn deteriorates a production yield.

To this end, recently, there is developed an outer focus ring member having therein a heater (see, e.g., Japanese Patent Laid-open Application No. 2000-36490 (hereinafter, referred to as "Patent Document"). In such an outer focus ring member, the temperature thereof can be stably maintained rather rapidly by controlling the heater, allowing a uniform plasma processing to be performed on the wafer.

In a plasma processing apparatus, dummy wafer are generally processed first with a recipe identical to that to be used in an actual production lot processing in order to stabilize an inner atmosphere of a processing chamber prior to starting the production lot processing. However, during the processing of the dummy wafers, deposits, i.e., reaction products of the processing gas, get deposited on the surface of the outer focus ring member if the temperature thereof has not increased enough. As the production lot processing continues, the deposits gradually get peeled off and then get adhered to the wafer as particles, which in turn detrimentally affects the production yield of the wafer. Accordingly, there arises a need to shorten a cleaning process cycle for removing the deposits from the outer focus ring member.

In the technical field of a CVD (chemical vapor deposition) plasma processing apparatus, it is well known that deposits can be removed fast by increasing the temperature of the member to which the deposits are adhered and the member can also be maintained in a condition where deposits can hardly be produced by maintaining the member at a high temperature. In case of using outer focus ring member of the aforementioned Patent Document, the deposits can be removed from the outer focus ring member by increasing the temperature of the outer focus ring member by controlling the heater. And then, the member can also be maintained in a condition where deposits can hardly be produced, which can prevent particles from adhering to the wafer and, also, a cleaning cycle can be lengthened.

The outer focus ring member is consumed by ions or the like colliding therewith during the plasma processing, requiring it to be regularly replaced. Since, however, the manufacturing cost as well as the running cost of using the outer focus ring member of the Patent Document is high because of the heater embedded therein. Further, a required wiring process of the heater complicates the replacement of the member and deteriorates the maintenability. It is also necessary to provide wiring for the heater in the mounting table. For such reasons, the outer focus ring member of the Patent Document may not be readily adopted.

SUMMARY OF THE INVENTION

It is, therefore, an object of the present invention to provide an easily usable ring-shaped component for use in a plasma processing, a plasma processing apparatus and an outer ring-shaped member capable of avoiding deterioration of a wafer production yield and lengthen a cleaning cycle.

In accordance with a first aspect of the present invention, there is provided a ring-shaped component for use in a plasma processing, including: an inner ring-shaped member provided to surround an outer periphery of a substrate to be subjected to the plasma processing; and an outer ring-shaped member provided to surround an outer periphery of the inner ring-shaped member, wherein the outer ring-shaped member has a first surface facing a plasma generation space side where a plasma is generated and a second surface facing an opposite side of the plasma generation space side, the second surface having thereon at least one ring-shaped groove.

Preferably, a thickness between the first surface and a bottom portion of the groove is about 1.5 mm to about 2.0 mm.

Preferably, the outer ring-shaped member is formed of at least any one of quartz, carbon, silicon and ceramic.

In accordance with a second aspect of the present invention, there is provided a ring-shaped component for use in a plasma processing, including: an inner ring-shaped member provided to surround an outer periphery of a substrate to be subjected to the plasma processing; and an outer ring-shaped member provided to surround an outer periphery of the inner ring-shaped member, wherein the outer ring-shaped member is formed of at least two laminated ring-shaped plates.

Preferably, among the laminated ring-shaped plates, a ring-shaped plate provided at a plasma generation space side has a thickness of about 1.5 mm to about 2.0 mm.

Preferably, the outer ring-shaped member of the second aspect of the present invention is formed of at least any one of quartz, carbon, silicon and ceramic.

In accordance with a third aspect of the present invention, there is provided a plasma processing apparatus including: the ring-shaped component of the first aspect; and a processing chamber wherein the plasma processing is performed on the substrate.

In accordance with a fourth another aspect of the present invention, there is provided a plasma processing apparatus including: the ring-shaped component of the second aspect; and a processing chamber wherein the plasma processing is performed on the substrate.

In accordance with a fifth aspect of the present invention, there is provided an outer ring-shaped member provided to surround an outer periphery of an inner ring-shaped member provided to surround an outer periphery of a substrate to be subjected to a plasma processing, the outer ring-shaped member including: a first surface facing a plasma generation space side where a plasma is generated; and a second surface facing an opposite side of the plasma generation space side, the second surface having thereon at least one ring-shaped groove.

In accordance with a sixth aspect of the present invention, there is provided an outer ring-shaped member provided to surround an outer periphery of an inner ring-shaped member provided to surround an outer periphery of a substrate to be subjected to a plasma processing, wherein the outer ring-shaped member is formed of at least two laminated ring-shaped plates.

In accordance with the ring-shaped component of the first aspect of the present invention, a plasma processing apparatus of the third aspect, and an outer ring-shaped member of the fifth aspect of the present invention, at least one ring-shaped groove is formed on the second surface of the outer ring-shaped member facing an opposite side of the plasma generation space side.

Therefore, the heat capacity of the outer ring-shaped member can be small and thus it is possible to sharply increase the temperature thereof by absorbing heat from the plasma and further to easily maintain the high temperature. As a result, the deposits adhered to the outer ring-shaped member can be rapidly removed and, also, the state in which the deposits are hardly deposited can be maintained. Accordingly, it is possible to avoid deterioration of a substrate production yield and lengthen a cleaning cycle of the ring-shaped component for use in a plasma processing. Further, only the ring groove is formed on the second surface in the outer ring-shaped member, which is a simple machining process. Thus, the outer ring-shaped member can be manufactured at a low cost, allowing a running cost to be reduced. Moreover, since the outer focus ring member can be easily replaced, it is possible to avoid a deterioration of the maintenability. Consequently, the ring-shaped component can be easily adopted.

In accordance with the ring-shaped component of the first aspect of the present invention, the thickness between the first surface of outer ring-shaped member and the bottom portion of the groove is from about 1.5 mm to about 2.0 mm, ensuring the stiffness of the outer ring-shaped member to be preserved to thereby prevent the outer ring-shaped member from being damaged.

In accordance with the ring-shaped component of the first aspect of the present invention, the outer ring-shaped member is formed of at least any one of quartz, carbon, silicon and ceramic. Thus, the outer ring-shaped member can be manufactured at a low cost, and the ring-shaped component can be easily adopted.

In accordance with the ring-shaped component of the second aspect of the present invention, the plasma processing apparatus of the fourth aspect of the present invention and the outer ring-shaped member of the sixth aspect of the present invention, the outer ring-shaped member is formed of at least two laminated ring-shaped plates. Therefore, the heat capacity of a ring-shaped plate disposed at the plasma generation space side can be small and thus it is possible to sharply increase the temperature thereof by absorbing heat from the plasma and further to easily maintain the high temperature. As a result, the deposits adhered to the corresponding ring-shaped plate can be rapidly removed in the earliest processing stage and, also, the state in which the deposits are hardly deposited can be maintained. Accordingly, it is possible to avoid deterioration of a substrate production yield and lengthen a cleaning cycle. Further, only plural ring-shaped plates are laminated in the outer ring-shaped member, a configuration thereof is simple. Thus, the outer ring-shaped member can be manufactured at a low cost, allowing the running cost to be reduced. Moreover, since the outer ring-shaped member can be easily replaced, it is possible to avoid a deterioration of the maintenability. Consequently, the ring-shaped component for use in a plasma processing can be easily adopted.

In accordance with the ring-shaped component of the second aspect of the present invention, the ring-shaped plate provided at a plasma generation space side has a thickness of about 1.5 mm to about 2.0 mm, ensuring the stiffness of the corresponding ring-shaped plate to be preserved to thereby prevent the corresponding ring-shaped plate from being damaged.

In accordance with the ring-shaped component of the second aspect of the present invention, the outer ring-shaped member is formed of at least any of quartz, carbon, silicon and ceramic. Thus, the outer ring-shaped member can be manufactured at a low cost, and the ring-shaped component can be easily adopted.

BRIEF DESCRIPTION OF THE DRAWINGS

The above and other objects and features of the present invention will become apparent from the following description of preferred embodiments, given in conjunction with the accompanying drawings, in which:

FIG. 5 represents a graph illustrating a relationship between a high frequency power application elapsed time and the number of measured particles in case of using the focus ring as the ring-shaped component for use in the plasma processing in accordance with the second preferred embodiment of the present invention;

DETAILED DESCRIPTION OF THE PREFERRED EMBODIMENT

Hereinafter, preferred embodiments of the present invention will be described with reference to the accompanying drawings.

First of all, the following is a description on a plasma processing apparatus employing a ring-shaped component for use in a plasma processing in accordance with a first preferred embodiment of the present invention.

Figure 1:
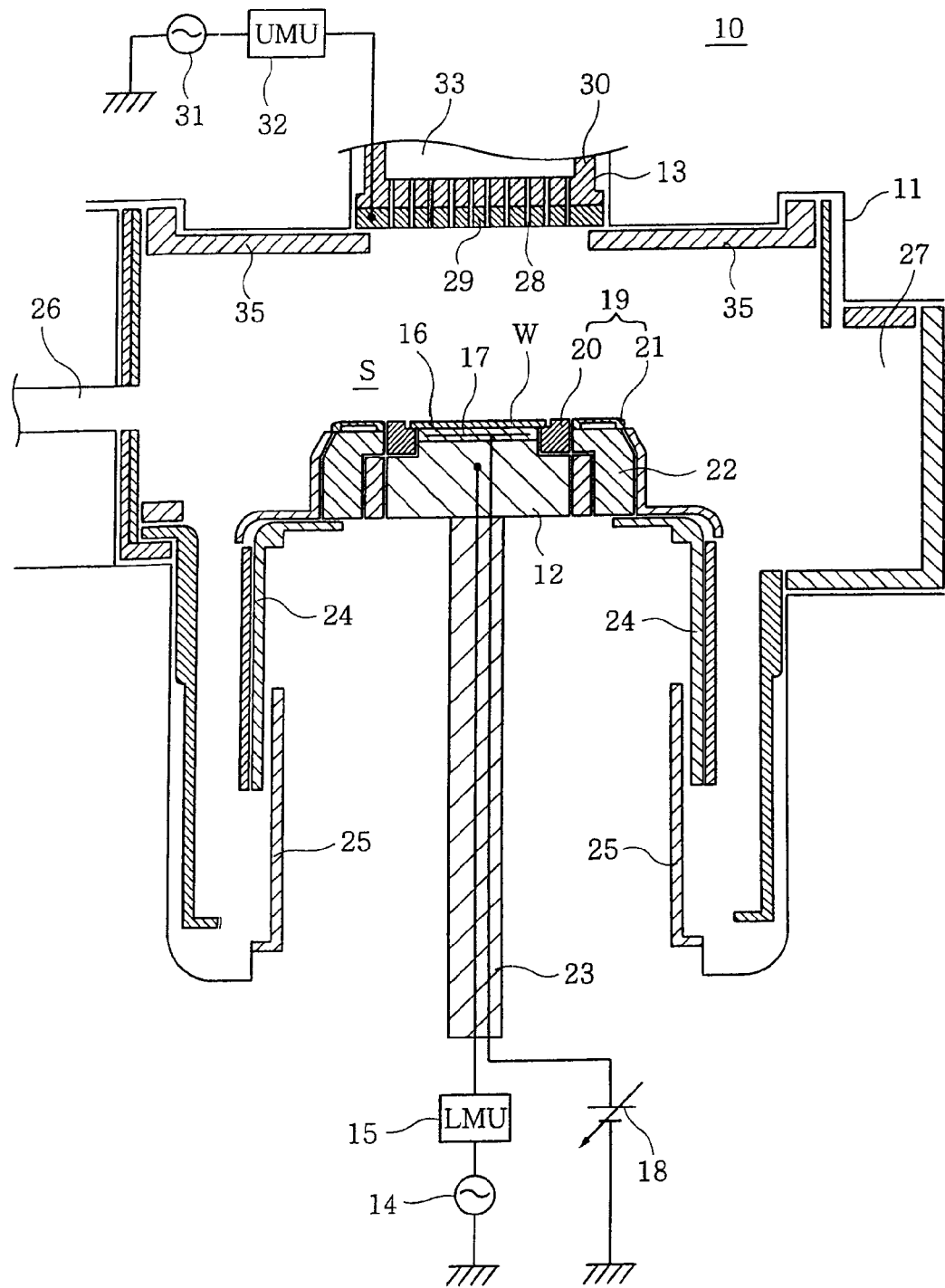
FIG. 1 is a schematic cross sectional view of a plasma processing apparatus employing a focus ring as a ring-shaped component for use in a plasma processing in accordance with a first preferred embodiment of the present invention.

FIG. 1 is a schematic cross sectional view of a plasma processing apparatus employing a focus ring as a ring-shaped component for use in the plasma processing in accordance with the first preferred embodiment of the present invention.

Referring to FIG. 1, a plasma processing apparatus 10 configured as an etching processing apparatus for performing a plasma processing, e.g., a reactive ion etching, on a wafer W for producing semiconductor devices has a chamber 11 serving as a processing chamber made of a metal such as aluminum or stainless steel.

Installed inside the chamber 11 are a lower electrode serving as a mounting table (wafer stage) for mounting thereon the wafer W having a diameter of, for example, 300 mm, and a shower head 13 provided on a ceiling portion of the chamber 11 to face the lower electrode 12. The lower electrode 12 vertically moves inside the chamber 11 with the wafer W mounted thereon, and the shower head 13 supplies a processing gas to be described later into the chamber 11.

A lower high frequency power supply 14 is connected to the lower electrode 12 via a lower matching unit (LMU) 15 and supplies a high frequency power to the lower electrode 12. Further, the lower matching unit 15 maximizes an incidence efficiency of the high frequency power on the lower electrode 12 by reducing a reflection of the high frequency power from the lower electrode 12.

Provided on the lower electrode 12 is an ESC (electrostatic chuck) 16 for adsorbing the wafer W thereto by using an electrostatic adsorptive force. The ESC 16 has therein an ESC electrode plate 17 formed of laminated electrode films, and a DC power supply 18 is electrically connected to the ESC electrode plate 17. Further, the ESC 16 adsorbs and holds the wafer W on a top surface thereof by the Coulomb force or the Johnson-Rahbek force generated by a DC voltage supplied from the DC power supply 18 to the ESC electrode plate 17.

Installed around the wafer W mounted on the ESC 16 is a circular ring-shaped focus ring 19 (ring-shaped component for use in a plasma processing) to surround an outer periphery of the wafer W. The focus ring 19 has a circular ring-shaped inner focus ring member 20 provided to surround an outer periphery of the mounted wafer W and a circular ring-shaped outer focus ring member 21 provided to surround an outer periphery of the inner focus ring member 20. The inner focus ring member 20 is mounted on the lower electrode 12, and the outer focus ring member 21 is mounted on an ESC covering member 22 provided to surround the lower electrode 12. The inner focus ring member 20 is made of a conductive material such as silicon or the like, whereas the outer focus ring member is made of an insulating material such as quartz or the like. The inner focus ring member 20 serves to collect on the wafer W a plasma generated in a processing space S (plasma generation space) between the lower electrode 12 and the shower head 13 and the outer focus ring member 21 serves as an insulator for confining the plasma on the wafer W. A shape of the outer focus ring member 21 will be described later in detail.

Provided under the lower electrode 12 is a support 23 downwardly extending from a lower surface of the lower electrode 12. The support 23 supports lower electrode 12, which is elevated by rotating a ball screw (not shown). Further, since a periphery of the support 23 is covered by covers 24 and 25, the support 23 is isolated from an inner atmosphere of the chamber 11.

Installed on a sidewall of the chamber 11 are a loading/unloading port 26 of the wafer W and a gas exhaust port 27. The wafer W is loaded into and unloaded from the chamber 11 via the loading/unloading port 26 by a transfer arm (not shown) of a LLM (load lock module) (not shown) provided near the plasma processing apparatus 10. The gas exhaust port 27 is connected to a gas exhaust system having an APC (automatic pressure control) valve, a DP (dry pump), a TMP (turbo molecular pump) or the like (all not shown) and exhausts air inside the chamber 11 or the like to the outside.

In such a plasma processing apparatus 10, when loading the wafer W into the chamber 11, the lower electrode 12 is lowered to a height equal to that of the loading/unloading port 26. Further, when plasma processing the wafer W, the lower electrode 12 is raised to a processing position of the wafer W. FIG. 1 shows a positional relationship between the loading/unloading port 26 and the lower electrode 12 when the wafer W is loaded into the chamber 11.

Further, the shower head 13 includes a circular plate shaped upper electrode plate 29 having a plurality of gas holes 28 facing the processing space S and an electrode plate support 30 installed on the upper electrode plate 29 to attachably and detachably support same. Further, an outer peripheral portion of a surface of the upper electrode plate 29 facing the processing space S is covered by an inner peripheral portion of a circular ring-shaped member provided on the ceiling portion of the chamber 11 as a shield ring 35. The shield ring 35 is made of quartz or the like, for example, and protects, from the plasma, screws (not shown) installed at an outer peripheral portion of the upper electrode plate 29 to fasten same to the ceiling portion of the chamber 11 from the plasma.

An upper high frequency power supply 31 is connected to the upper electrode plate 29 via an upper matching unit (UMU) 32 and supplies a high frequency power to the upper electrode plate 29. Further, the upper matching unit 32 maximizes an incidence efficiency of the high frequency power on the upper electrode plate 29 by reducing a reflection of the high frequency power from the upper electrode plate 29.

A buffer chamber 33 is provided inside the electrode plate support 30 and connected with a processing gas inlet line (not shown). A processing gas containing $CF_4$, $O_2$ and Ar, for example, is introduced into the buffer chamber 33 through the processing gas inlet line and then supplied into the processing space S via the gas holes 28.

As described above, ions and/or radicals are generated in the chamber 11 of the plasma processing apparatus 10 by generating a high density plasma from the processing gas in the processing space S with the high frequency powers supplied to the lower electrode 12 and the upper electrode plate 29. The ions and/or radicals thus generated are collected on a surface of the wafer W by the focus ring 19 and used for physically or chemically etching the surface of the wafer W.

In such a plasma processing apparatus 10, a plasma processing of a dummy wafer is performed prior to a processing for a production lot of the wafers. In order to perform the plasma processing of the dummy wafer, the dummy wafer is loaded into the chamber 11 and, then, a plasma is generated from a processing gas introduced into the chamber 11 according to a preset recipe. By performing the plasma processing on the dummy wafer as described above, the inner atmosphere of the chamber 11 can be stabilized. During the process, reaction products are generated by chemical reactions between the plasma of the processing gas and materials existing on the surface of the dummy wafer. However, the outer focus ring member 21 insufficiently absorbs heat from the plasma and thus has a low temperature, a large amount of the generated reaction products are adhered to the surface of the outer focus ring as deposits. Such deposits get peeled off and then adhered onto the wafer as particles, thereby deteriorating the production yield of the wafer. To that end, there arises a need to remove the deposits at the earliest processing stage of the production lot and then maintain a state in which the deposits get hardly deposited. The recipe of the plasma processing for the dummy wafer may be identical to or different from that of the plasma processing for the production lot.

As described above, there is known in the field of the CVD processing apparatus that by raising the temperature of the member to which the deposits are adhered, it is possible to remove the deposits and maintain a state in which the deposits get hardly deposited. Therefore, in order to check whether or not the same effects can be obtained from the etching processing apparatus, the present inventor has observed a relationship between a plasma processing time (high frequency power application elapsed time) and the amount of deposits adhered to the outer focus ring member in case of using the plasma processing apparatus 10 employing a conventional outer focus ring member instead of the outer focus ring member 21. As a result, it was found that the amount of deposits adhered in large quantity by the plasma processing of the dummy wafer decreases as the high frequency power application elapsed time increases and then are mostly removed 25 hours later.

In the plasma processing, since the temperature of the outer focus ring member increases by the heat absorbed from the plasma, the longer the high frequency power application elapsed time is, the longer a period of time in which the outer focus ring member is maintained at a high temperature is. In other words, the longer the period of time in which the outer focus ring member is maintained at the high temperature is, the less the amount of deposits adhered to the outer focus ring member is. Accordingly, the present inventor has found that by raising the temperature of the member (outer focus ring member) to which the deposits are adhered, it is also possible in the etching processing apparatus to remove the deposits and maintain a state in which the deposits are hardly deposited. Moreover, based on the information in which the deposits can be removed by increasing the temperature of the outer focus ring member, the present inventor has inferred that the deposits can be rapidly removed by rapidly increasing the temperature of the outer focus ring member.

Hence, the outer focus ring member 21 of this embodiment has a structure enabling a rapid temperature increase, which will be described hereinafter.

Figure 2:
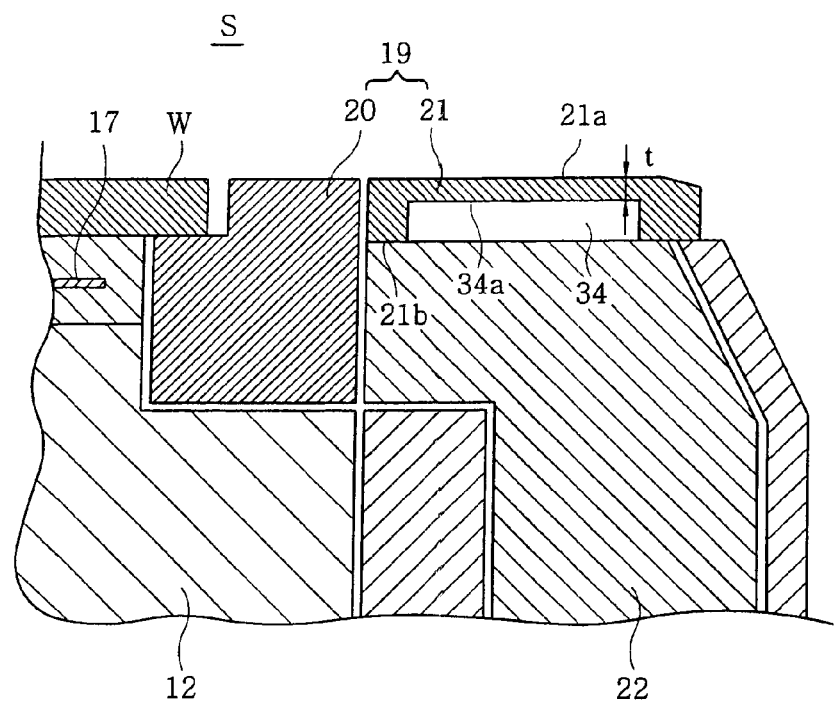
FIG. 2 describes an enlarged cross sectional view of a peripheral portion of the focus ring of FIG. 1.

FIG. 2 is an enlarged cross sectional view around the focus ring 19 in FIG. 1.

Referring to FIG. 2, the outer focus ring member 21 is a circular ring-shaped flat plate member made of, e.g., quartz and includes a plasma exposure surface 21a (first surface) facing the processing space S side and a covering member contact surface 21b (second surface) facing the opposite side of the processing space S while being in contact with the ESC covering member 22. Formed on the covering member contact surface 21b of the outer focus ring member 21 is a ring groove 34 having a ring shape concentric with the outer focus ring member 21. The ring groove 34 has a rectangular cross sectional shape and is formed by a counter boring.

By graving the aforementioned ring groove 34, there are formed in the outer focus ring member 21 has a thin portion and two thick portions respectively surrounding an inner side and an outer side of the thin portion. A thickness of the thin portion, i.e., a thickness t between a bottom portion 34a of the ring groove 34 and the plasma exposure surface 21a is set to be between about 1.5 mm and about 2.0 mm. Further, a thickness of the thick portion, i.e., a thickness between the plasma exposure surface 21a and the covering member contact surface 21b is set to be about 3.5 mm. Due to the presence of the thin portion, the outer focus ring member 21 has a smaller volume compared with the conventional outer focus ring member and thus has a smaller heat capacity.

Since the outer focus ring member 21 is made by cutting a pure quartz material, its surface is not smooth but it has a rough surface covered with fine protrusions formed thereby. Therefore, the covering member contact surface 21b is in, e.g., point contact with the ESC covering member 22 via the multiple protrusions without being in surface contact therewith. Accordingly, an actual contact area between the covering member contact surface 21b and the ESC covering member 22 occupies only about 1% of a surface area of the covering member contact surface 21b. As a result, the heat is hardly transferred from the outer focus ring member 21 to the ESC covering member 22.

In accordance with the focus ring 19 serving as the ring-shaped component for use in plasma processing of this embodiment, the outer focus ring member 21 is provided with the thin portion by forming the ring groove 34 having a ring shape concentric with the outer focus ring member 21 on the covering member contact surface 21b of the outer focus ring member 21. Consequently, the outer focus ring member 21 has a smaller volume than the conventional outer focus ring member 21 and thus has a smaller heat capacity. In case the heat capacity is small, it is possible to sharply increase the temperature thereof by absorbing heat from the plasma during the plasma processing and further to easily maintain the high temperature. Thus, the deposits adhered to the outer focus ring member 21 can be rapidly removed and, also, the state in which the deposits are hardly deposited can be maintained. Accordingly, the deposits adhered to the outer focus ring member 21 can be removed at the earliest processing stage of the production lot and, thereafter the deposits can be prevented from being adhered to the outer focus ring member 21. As a result, it is possible to avoid a deterioration of the wafer production yield and lengthen the cleaning cycle of the focus ring 19.

In the outer focus ring member 21, only the ring groove 34 is formed on the covering member contact surface 21b, which is a simple machining process. Thus, the outer focus ring member 21 can be manufactured at a low cost, allowing a running cost to be reduced. Moreover, since the outer focus ring member 21 can be easily replaced, it is possible to avoid a deterioration of the maintenability. Consequently, the focus ring 19 can be easily used in the plasma processing apparatus 10.

In order to reduce the heat capacity, it is preferable to minimize the thickness of the outer focus ring member 21. However, if the thickness is excessively thin, e.g., about 1 mm, the outer focus ring member 21 may get easily damaged. In the aforementioned focus ring 19, the thickness between the plasma exposure surface 21a of the outer focus ring member 21 and the bottom portion 34a of the ring groove 34 is from about 1.5 mm to about 2.0 mm, ensuring the stiffness of the outer focus ring member 21 to be preserved to thereby prevent the outer focus ring member 21 from being damaged.

Although the aforementioned focus ring 19 has the outer focus ring member 21 made of quartz, the material for the outer focus ring member 21 is not limited thereto. The outer focus ring member 21 can be made of any one of quartz, carbon, silicon, ceramic (yttrium oxide ($Y_2O_3$) or silica) or the like. Since any of those materials are easily obtainable, the focus ring 19 can be manufactured at a low cost and thus used with less reservation given to the cost issue.

Figure 4A:
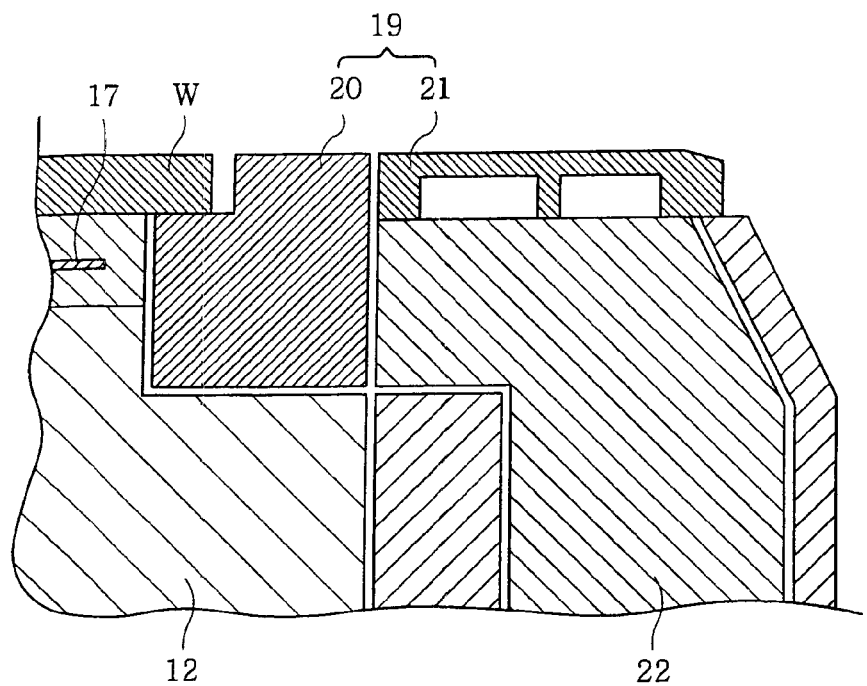
FIGS. 4A and 4B present enlarged cross sectional views of modified example of the focus rings employed as the ring-shaped components for use in a plasma processing in accordance with the first and the second preferred embodiment of the present invention, respectively.

In the aforementioned focus ring 19, a single groove is formed on the covering member contact surface 21b of the outer focus ring member 21. However, the number of grooves is not limited thereto but can vary as long as it is possible to properly set the heat capacity of the outer focus ring member 21. For example, two grooves can be formed thereon (see FIG. 4A). Moreover, a cross sectional shape of the groove can vary without being limited to the rectangular shape. In order to ensure that it is to be strong enough, the groove is preferably formed in a circular arc shape, for example.

Besides, in the aforementioned focus ring 19, the thick portions formed at the inner side and the outer side of the thin portion. Therefore, even if the outer focus ring member 21 is consumed by the ions or the like colliding therewith, sharp-edged portions are not formed at an inner and an outer peripheral portion of the outer focus ring member 21, preventing an operator from being injured by the sharp-edged portions. Further, a second moment of area can be ensured, so that the stiffness of the outer focus ring member 21 can be improved.

In addition, in the focus ring 19, the outer focus ring member 21 has the ring groove 34 formed on the covering member contact surface 21b, so that the outer focus ring member 21 can be accurately mounted on the ESC covering member 22 without misaligning the plasma exposure surface 21a and the covering member contact surface 21b.

Hereinafter, a plasma processing apparatus employing a ring-shaped component for use in plasma processing in accordance with a second preferred embodiment will be described.

This embodiment has the same configuration and operation as those of the first embodiment, except for the focus ring structure thereof. Therefore, the description of repeated configuration and operation will be omitted and only the difference will be described hereinafter.

Figure 3:
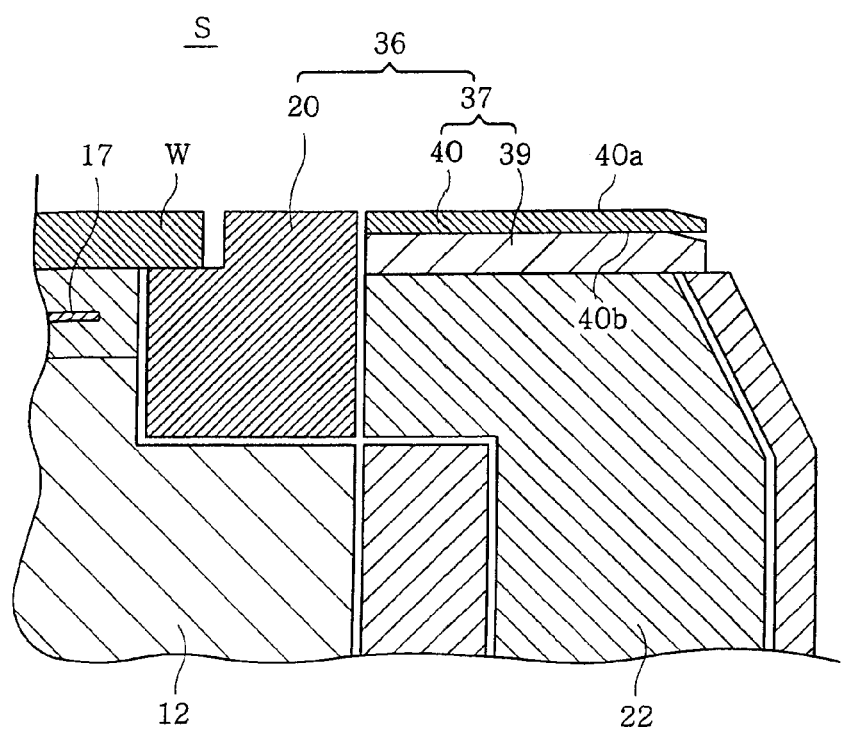
FIG. 3 provides an enlarged cross sectional view of a peripheral portion of a focus ring employed in the plasma processing apparatus as a ring-shaped component for use in a plasma processing in accordance with a second preferred embodiment of the present invention.

FIG. 3 provides an enlarged cross sectional view around a focus ring employed in a plasma processing apparatus as the ring-shaped component for use in plasma processing in accordance with the second preferred embodiment of the present invention.

Referring to FIG. 3, the focus ring 36 includes an inner focus ring member 20 and an outer focus ring member 37 provided to surround an outer periphery of the inner focus ring member 20. The outer focus ring member 37 is formed of two laminated round ring-shaped plate members, i.e., a lower outer focus ring plate 39 and an upper outer focus ring plate 40. Since the lower and the upper outer focus ring plates 39 and 40 are all made of an insulating material, e.g., quartz, the outer focus ring member 37 also serves as an insulator for confining the plasma on the wafer W.

In the outer focus ring member 37, the lower outer focus ring plate 39 is mounted on the ESC covering member 22 and the upper outer focus ring plate 40 is mounted on the lower outer focus ring plate 39. Therefore, a upper surface 40a (first surface) of the upper outer focus ring plate 40 faces the processing space S. Accordingly, most of the deposits get adhered onto the upper surface 40a of the upper outer focus ring plate 40 during the plasma processing of the dummy wafer.

The lower and the upper outer focus ring plates 39 and respectively have uniform thicknesses from inner peripheral portions to vicinities of outer peripheral portions. Specifically, the upper outer focus ring plate 40 has a thickness of about 1.5 mm to about 2.0 mm. Accordingly, the upper outer focus ring plate 40 has a smaller volume than the conventional outer focus ring member having a thickness of 3.5 mm and thus has a smaller heat capacity.

Since the upper outer focus ring plate 40 is also formed by cutting a pure quartz material, its surface is not smooth but it has a rough surface covered with fine protrusions formed thereby. Thus, the upper outer focus ring plate 40 is in, e.g, point contact with the lower outer focus ring plate 39 via the multiple protrusions without being in surface contact therewith. Accordingly, an actual contact area between the upper outer focus ring plate 40 and the lower outer focus ring plate 39 occupies only about 1% of a surface area of a lower surface 40b (second surface) of the upper outer focus ring plate 40 which faces an opposite side of the processing space S side. As a result, the heat is hardly transferred from the upper outer focus ring plate 40 to the lower outer focus ring plate 39.

In accordance with the focus ring 19 serving as a ring-shaped component for use in plasma processing of this embodiment, the outer focus ring member 37 is formed of the two laminated round-ring shaped plate members, i.e., the lower outer focus ring plate 39 and the upper outer focus ring plate 40. Thus, the upper outer focus ring plate 40 can be made thinner than the conventional outer focus ring member. Accordingly, the upper outer focus ring plate 40 has a smaller volume than the conventional focus ring and thus has a smaller heat capacity. In case the heat capacity is small, it is possible to rapidly increase a temperature by absorbing heat from the plasma during the plasma processing and further to easily maintain the high temperature. Therefore, the deposits adhered to the upper outer focus ring plate 40 can be rapidly removed and, also, the state in which the deposits are hardly deposited can be maintained. Hence, the deposits adhered to the upper outer focus ring plate 40 can be removed at the earliest processing stage of the production lot and, thereafter, the deposits can be prevented from being adhered to the upper outer focus ring plate 40. As a result, it is possible to avoid a deterioration of the wafer production yield and lengthen the cleaning cycle of the focus ring 36.

Further, since only the lower and the upper outer focus ring plates 39 and 40 are laminated in the outer focus ring member 37, the configuration thereof is simple. Thus, the outer focus ring member 37 can be manufactured at a low cost, allowing the running cost to be reduced. Moreover, since the outer focus ring member 37 can be easily replaced, it is possible to avoid a deterioration of the maintenability. Consequently, the focus ring 36 can be easily adopted in the plasma processing apparatus 10.

In order to reduce the heat capacity, it is preferable to minimize a thickness of the upper outer focus ring plate 40. However, if the thickness is set to be excessively thin, e.g., about 1 mm, the upper outer focus ring plate 40 may get easily damaged. According to the aforementioned focus ring 36, the upper outer focus ring plate 40 has a thickness between about 1.5 mm and about 2.0 mm, ensuring the stiffness of the upper outer focus ring plate 40 to be preserved to thereby prevent the upper outer focus ring plate 40 from being easily damaged.

Although the aforementioned focus ring 36 has the outer focus ring member 37 made of quartz in the aforementioned focus ring 36, the outer focus ring member 37 can be made of any one of quartz, carbon, silicon, ceramic or the like without being limited thereto, as in case of the focus ring 19 of the first embodiment.

Figure 4B:
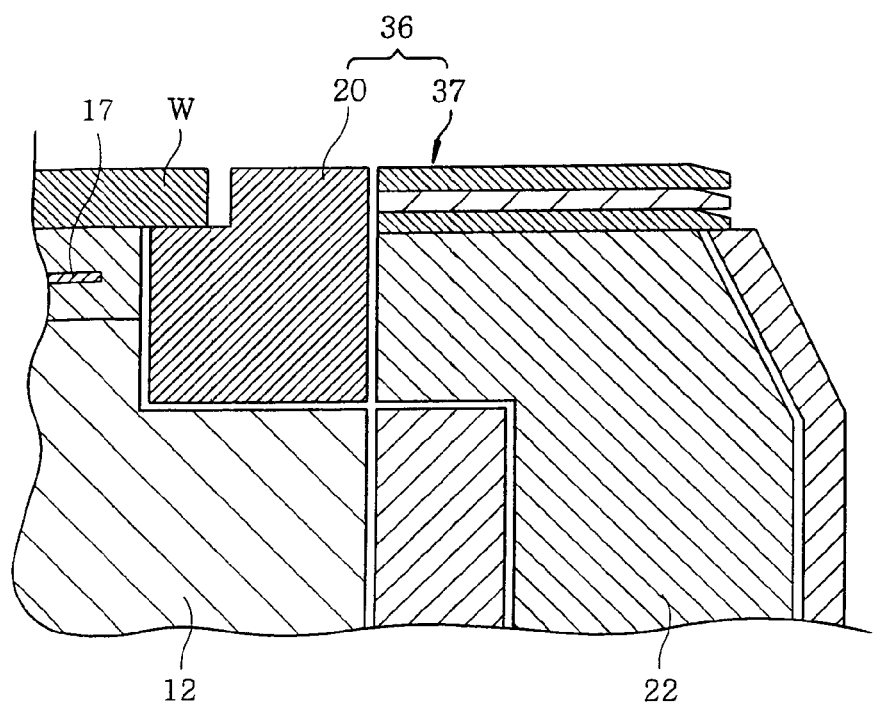

The outer focus ring member 37 of the focus ring 36 is formed of the two laminated circular ring-shaped plate members. However, the lamination number is not limited thereto but can vary as long as it is possible to properly set the heat capacity of the upper outer focus ring plate and also ensure the stiffness thereof. For example, three circular ring-shaped plate members may be laminated (see FIG. 4B).

Figure 7:
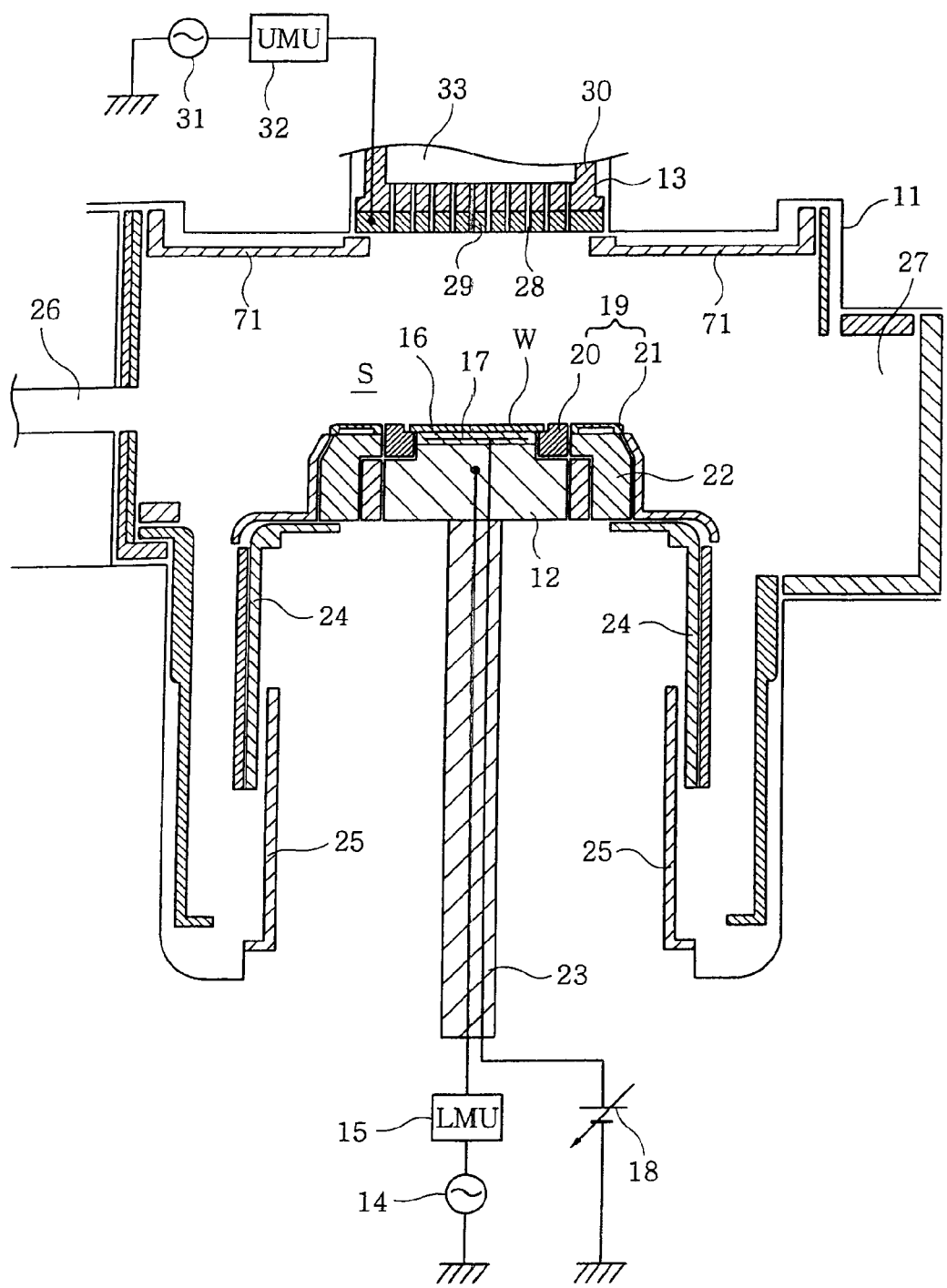
FIG. 7 provides a schematic cross sectional view of a plasma processing apparatus employing a shield ring as a ring-shaped component for use in the plasma processing in accordance with another preferred embodiment of the present invention.

In the aforementioned embodiments, the circular ring-shaped component for use in plasma processing of the present invention is applied to the focus ring. However, the circular ring-shaped component for use in plasma processing of the present invention can be applied to other components for use in plasma processing, e.g., a shield ring (see a shield ring 71 of a plasma processing apparatus 70 shown in FIG. 7). Moreover, such other components for use in plasma processing can have any shapes without being limited to the circular ring shape.

Although a plasma processing apparatus employed in the aforementioned embodiments is an etching apparatus, the present invention can be applied to any plasma processing apparatus having a circular ring-shaped component installed in a processing chamber, e.g., a CVD processing apparatus.

A substrate to be subjected to a plasma processing in the plasma processing apparatus of the aforementioned embodiments is not limited to a wafer for producing semiconductor devices but can be a substrate for use in a LCD (liquid crystal display), a FPD (flat panel display) or the like. It can also be a photo mask, a CD substrate, printed circuit board or the like.

EXAMPLES

Hereinafter, examples of the present invention will be described in detail.

Example 1

As for a focus ring installed the plasma processing apparatus 10, the focus ring 36 of the aforementioned second embodiment was employed. Herein, the upper outer focus ring plate 40 of the outer focus ring member 37 was set to have a thickness of 1.7 mm.

Next, a plasma processing was conducted, which includes: the first step of performing the plasma processing on a wafer with a processing gas of $CF_4/Ar/CO$; the second step of performing the plasma processing on the wafer with a processing gas of $C_4F_8/CO/Ar$; the third step of performing the plasma processing on the wafer with a processing gas of $Ar/O_2$; and the fourth step of performing the plasma processing on the wafer with a processing gas of $CHF_3/Ar/O_2$. Then the number of particles having a diameter greater than 0.20 μm which are adhered to a surface of the plasma-processed wafer was measured at every specific high frequency power application elapsed time. FIG. 5 provides a graph illustrating a relationship between the high frequency power application elapsed time and the number of measured particles.

Comparative Example 1

As for a focus ring accommodated in the plasma processing apparatus 10, a conventional focus ring having a thickness of 3.5 mm was employed.

Figure 6:
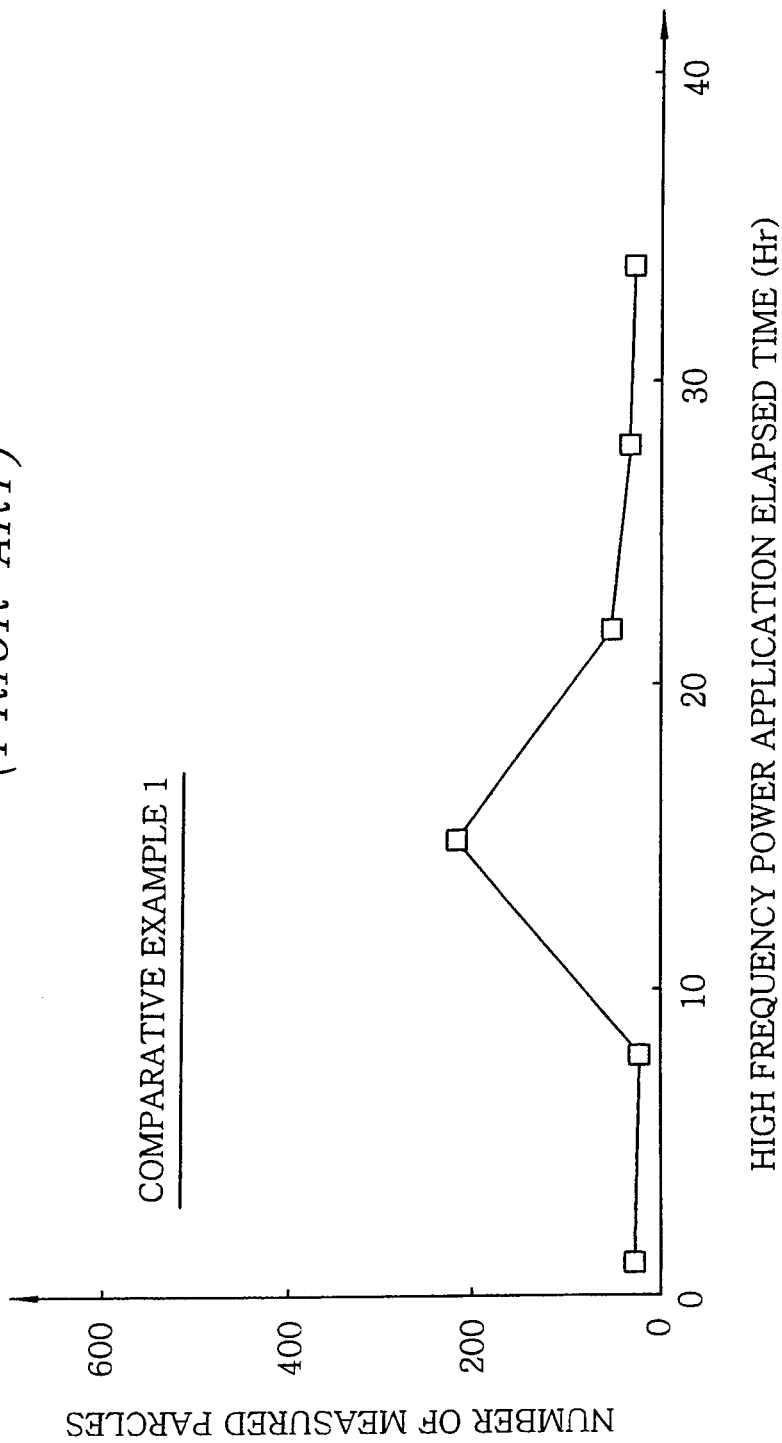
FIG. 6 offers a graph describing a relationship between a high frequency power application elapsed time and the number of measured particles in case of using a conventional focus ring.

Thereafter, by performing the plasma processing same as that of the Example 1, the number of particles having a diameter greater than 0.20 μm which are adhered to a surface of the plasma-processed wafer was measured at every specific high frequency power application elapsed time. FIG. 6 offers a graph describing a relationship between the high frequency power application elapsed time and the number of measured particles.

According to the result of comparing the graphs shown in FIGS. 5 and 6, in the Comparative Example 1, more than 50 particles were measured when the high frequency power application elapsed time reached about 15 hours, the number 50 being a threshold for determining whether or not the focus ring should be cleaned. On the contrary, in the Example 1, the number of measured particles exceeds the threshold when the high frequency power application elapsed time reached about 48 hours.

The following is an explanation for the difference described above. In case of the Comparative Example 1, the deposits adhered to the focus ring during the plasma processing get hardly removed when the high frequency power application elapsed time is short. Since, however, an adhesive strength of the deposits becomes weak due to a thermal history followed by an elapse of the high frequency power application elapsed time, the deposits get suddenly peeled off when the high frequency power application elapsed time reaches about 15 hours. On the other hand, in case of the Example 1, even when the high frequency power application elapsed time is short, most of the deposits adhered to the upper outer focus ring plate 40 during the plasma processing are removed by rapidly increasing temperature of the upper outer focus ring plate 40. Moreover, due to the thermal history followed by the increase of the high frequency power application elapsed time, a state in which the deposits are hardly deposited is maintained. Accordingly, the amount of residual deposits is small and, also, the amount of deposits does not increase, so that particles are hardly generated.

Further, an upper outer focus ring plate 40 (Example 2) having a thickness of 2.5 mm was installed in the plasma processing apparatus 10 in addition to the upper outer focus ring plate 40 employed in the aforementioned Example 1 and then the plasma processing of the aforementioned Example 1 was performed on one lot. After that, the amount of deposits added to each ring plate was visually checked and it was found that the amount of deposits adhered to the upper outer focus ring plate 40 of the Example 1 was remarkably smaller than that of the Example 2.

As a result, it was found that as the heat capacity of the outer focus ring is reduced, the deposits can be rapidly removed even when the high frequency power application elapsed time is short and, also, the state in which the deposits are hardly deposited can be easily maintained.

While the invention has been shown and described with respect to the preferred embodiments, it will be understood by those skilled in the art that various changes and modification may be made without departing from the scope of the invention as defined in the following claims.

What is claimed is:

1. A mounting table for mounting thereon a substrate comprising:
   a lower electrode to which a high frequency power is supplied to generate a plasma to thereby process the substrate;
   an electrostatic chuck for holding the substrate thereto by using an electrostatic adsorptive force, wherein the electrostatic chuck is disposed on the lower electrode and a diameter of the electrostatic chuck is smaller than a diameter of the substrate;
   an electrode plate disposed in the electrostatic chuck;
   an inner ring-shaped member provided on the lower electrode to surround the electrostatic chuck, a part of the lower electrode, and an outer periphery of the substrate;
   a covering member provided to surround the lower electrode and the outer periphery of the inner ring-shaped member; and
   an outer ring-shaped member provided on the covering member to surround an outer periphery of the inner ring-shaped member,
   wherein the outer ring-shaped member includes a plurality of stacked plates, including:
      an upper ring-shaped plate having an upper surface facing a processing space where the substrate is processed, and
      a lower ring-shaped plate mounting thereon the upper ring-shaped plate, the lower ring-shaped plate being mounted on the covering member, and
      wherein a plurality of protrusions is formed on a lower surface of the upper ring-shaped plate by way of which the lower surface of the upper ring-shaped plate is in point contact with the lower ring-shaped plate.

2. The mounting table of claim 1, wherein the upper ring-shaped plate has a thickness of about 1.5 mm to about 2.0 mm.

3. The mounting table of claim 1, wherein the outer ring-shaped member is formed of at least one of quartz, carbon, silicon, and ceramic.

4. The mounting table of claim 1, wherein a contact area between the upper and the lower ring-shaped plates is equal to or smaller than 1% of a surface area of a lower surface of the upper ring-shaped plate.

5. The mounting table of claim 1, wherein a number of the stacked plates is three.

6. The mounting table of claim 1, wherein the upper ring-shaped plate consists of an electrically insulating material.

7. The plasma processing apparatus of claim 1, wherein each of the upper ring-shaped plate and the lower ring-shaped plate extends to an outer periphery of the outer ring-shaped member.

8. A plasma processing apparatus comprising:
   a processing chamber wherein a plasma processing is performed on a substrate;
   a mounting table for mounting thereon the substrate, the mounting table being disposed in the processing chamber;
   a gas supply member for supplying a gas into the processing chamber;
   a gas exhaust port for exhausting air inside the processing chamber with the help of a pump,
   wherein the mounting table includes:
      a lower electrode to which a high frequency power is supplied to generate a plasma to thereby process the substrate,
      an electrostatic chuck for holding the substrate thereto by using an electrostatic adsorptive force, wherein the electrostatic chuck is disposed on the lower electrode and a diameter of the electrostatic chuck is smaller than a diameter of the substrate,
      an electrode plate disposed in the electrostatic chuck,
      an inner ring-shaped member provided on the lower electrode to surround the electrostatic chuck, a part of the lower electrode, and an outer periphery of the substrate,
      a covering member provided to surround the lower electrode and the outer periphery of the inner ring-shaped member,
      an outer ring-shaped member provided on the covering member to surround an outer periphery of the inner ring-shaped member, and
   wherein the outer ring-shaped member includes a plurality of stacked plates, including:
      an upper ring-shaped plate having an upper surface facing a processing space where the substrate is processed; and
      a lower ring-shaped plate mounting thereon the upper ring-shaped plate, the lower ring-shaped plate being mounted on the covering member, and
      wherein a plurality of protrusions is formed on a lower surface of the upper ring-shaped plate via which the lower surface of the upper ring-shaped plate is in point contact with the lower ring-shaped plate.

9. The plasma processing apparatus of claim 8, wherein the upper ring-shaped plate has a thickness of about 1.5 mm to about 2.0 mm.

10. The plasma processing apparatus of claim 8, wherein the outer ring-shaped member is formed of at least one of quartz, carbon, silicon and ceramic.

11. The plasma processing apparatus of claim 8, wherein a contact area between the upper and the lower ring-shaped plates is equal to or smaller than 1% of a surface area of a lower surface of the upper ring-shaped plate.

12. The plasma processing apparatus of claim 8, wherein a number of the stacked plates is three.

13. The plasma processing apparatus of claim 8, wherein the upper ring-shaped plate consists of an electrically insulating material.

14. The plasma processing apparatus of claim 8, wherein each of the upper ring-shaped plate and the lower ring-shaped plate extends to an outer periphery of the outer ring-shaped member.

* * * * *